United States Patent
Zhou

(10) Patent No.: US 6,588,949 B1
(45) Date of Patent: *Jul. 8, 2003

(54) METHOD AND APPARATUS FOR HERMETICALLY SEALING PHOTONIC DEVICES

(75) Inventor: Ping Zhou, Glendale, AZ (US)

(73) Assignee: Honeywell Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/224,210

(22) Filed: Dec. 30, 1998

(51) Int. Cl.[7] ................................................. G02B 6/36
(52) U.S. Cl. .......................... 385/94; 385/88; 385/92; 372/107; 372/108
(58) Field of Search .......................... 385/88, 92, 94; 372/107, 108

(56) References Cited

U.S. PATENT DOCUMENTS

| | | | | |
|---|---|---|---|---|
| 4,897,711 | A | * 1/1990 | Blonder et al. | 257/432 |
| 5,262,364 | A | 11/1993 | Brow et al. | |
| 5,545,893 | A | * 8/1996 | Brown et al. | 250/239 |
| 5,744,848 | A | * 4/1998 | Harazono | 257/433 |
| 5,808,325 | A | 9/1998 | Webb | |
| 5,977,567 | A | * 11/1999 | Verdiell | 257/432 |
| 6,130,448 | A | * 10/2000 | Bauer et al. | 257/215 |
| 6,194,789 | B1 | * 2/2001 | Zhou | 257/787 |
| 6,222,967 | B1 | * 4/2001 | Amano et al. | 385/49 |
| 6,388,264 | B1 | * 5/2002 | Pace | 250/239 |

FOREIGN PATENT DOCUMENTS

| | | |
|---|---|---|
| EP | 0 355 522 A2 | 2/1990 |
| EP | 0 786 838 A2 | 7/1997 |
| GB | 2 312 551 A | 10/1997 |

OTHER PUBLICATIONS

An Article entitled "Plastic–Based Receptacle–Type VCSEL–Array Modules with One and Two Dimensions Fabricated Using the Self–Alignment Mounting Technique" by Hideo Kosaka, Mikihiro Kajita, Mitsuki Yamada, and Yoshimasa Sugimoto from NEC Opto–Electronics Research Laboratories, 34 Miyukigaoka, Tsukuba, Ibaraki 305, Japan and Kazuhiko Kurata and Takashi Tanabe from NEC 2nd Transmission Division, 1753 Shimonumabe, Nakahara–ku, Kawasaki–shi, Kanagawa 211, Japan in the 1997 IEEE Electronics Components and Technology Conference.

(List continued on next page.)

Primary Examiner—Frank G. Font
Assistant Examiner—Roy M. Punnoose
(74) Attorney, Agent, or Firm—Andrew A. Abeyta; Brett Carlson

(57) ABSTRACT

A hermetically sealed photonic device submount includes a photonic device mounted on a substrate material and sealed in a flexible hermetic seal. In one configuration, the photonic device is configured to emit or to receive light through the substrate material. In this configuration, the photonic device is covered with an adhesive layer and a metal layer deposited onto the adhesive layer. In another configuration, the photonic device is configured to emit or to receive light in a direction substantially vertically upward from the substrate material. In this configuration, a cover is placed over the photonic device, then the cover is hermetically sealed to the substrate material with an adhesive layer and a metal layer depositd onto the adhesive layer. In both configurations, the photonic device submounts are hermetically sealed according to various aspects of the present invention on the substrate material without using a separate package. Accordingly, any number of hermetically sealed photonic device submounts can be mass produced on wafers using the present invention.

29 Claims, 9 Drawing Sheets

OTHER PUBLICATIONS

An Article entitled "OPTOBUS™ I: A Production Parallel Fiber Optical Interconnect" by L.J. Norton, F. Carney, N. Choi, C.K.Y. Chun, R.K. Denton Jr., D. Diaz, J. Knapp, M. Meyering, C. Ngo, S. Planer, G. Raskin, E. Reyes, J. Sauvageau, D.B. Schwartz, S.G. Shook, J. Yoder and Y. Wen, Motorola, 1300 N. Alma School Rd., Chandler, AZ 85224–CH200 from IEEE 1997 Electronic Components and Technology Conference.

* cited by examiner

METHOD AND APPARATUS FOR HERMETICALLY SEALING PHOTONIC DEVICES

BACKGROUND OF THE INVENTION

1. Field of the Invention

The present invention generally relates to methods and apparatus for hermetically sealing opto-electronic devices. More particularly, the present invention relates to a system for hermetically sealing photonic devices such as vertical cavity surface emitting lasers (VCSELs), photo-detectors, and the like.

2. Description of the Related Art

The use of photonic devices, such as VCSELs and photo-detectors, is becoming increasingly popular in the communications and electronics industry. Briefly, a VCSEL is a semiconductor laser which typically emits light normal to the surface to which it is mounted, and a photo-detector typically receives the light transmitted by the VCSEL. In general, photonic devices are used for transmitting data in the form of pulses of light in optical fibers such as in forming data links for parallel transmission and network computing. Photonic devices are particularly desirable as they can be processed, tested and screened on wafers, which facilitates high yield and thus low cost production.

However, the performance of photonic devices, has been found to be subject to environmental contaminants such as dust, moisture, and industrial chemicals. For example, moisture can damage or seriously degrade the performance of photonic devices. Therefore, it is desirable to hermetically seal photonic devices to protect them from dust, moisture, and other environmental contaminants.

A conventional method of sealing photonic devices involves covering the photonic devices in epoxy. As moisture can still penetrate the epoxy seal, however, a true hermetic seal is not formed. Other conventional methods of hermetically sealing photonic devices typically encase the photonic devices inside of TO can packages, which are typically Kovar metal cans with optical windows, and seals the packages with weld or solder. In generally, however, only one photonic device at a time can be hermetically sealed using these methods. Accordingly, these methods are generally costly and time intensive.

SUMMARY OF THE INVENTION

The present invention relates to hermetically sealing photonic devices such as vertical cavity surface emitting lasers (VCSELs), photo-detectors, and the like. In accordance with an exemplary embodiment of the present invention, a photonic device is mounted on a substrate material and sealed in a flexible hermetic seal. In one configuration, the photonic device is configured to emit or to receive light through the substrate material. In this configuration, the photonic device is covered with an adhesive layer and a metal layer deposited onto the adhesive layer. In another configuration, the photonic device is configured to emit or to receive light in a direction substantially vertically upward from the substrate material. In this configuration, a cover is placed over the photonic device, then the cover is hermetically sealed to the substrate material with an adhesive layer and a metal layer deposited onto the adhesive layer. In both configurations, the photonic devices are hermetically sealed according to various aspects of the invention on the substrate material without using a separate package. Accordingly, any number of hermetically sealed photonic device submounts can be mass produced on wafers using the present invention.

DESCRIPTION OF THE DRAWINGS

The subject matter of the invention is particularly pointed out and distinctly claimed in the concluding portion of the specification. The invention, however, both as to organization and method of operation, may best be understood by reference to the following description taken in conjunction with the claims and the accompanying drawing, in which like parts may be referred to by like numerals:

DETAILED DESCRIPTION OF THE PREFERRED EXEMPLARY EMBODIMENT

The subject matter of the present invention is particularly suited for use in connection with photonic devices, such as VCSELs, photo-detectors, and the like. As a result, exemplary embodiments of the present invention are described in that context. It should be recognized, however, that such description is not intended as a limitation on the use or applicability of the present invention, but is instead provided to enable a full and complete description of the exemplary embodiments.

A flexible hermetic sealing system according to various aspects of the present invention suitably provides for hermetically sealing photonic devices on a substrate material such as glass, silicon, ceramic, plastic, printed circuit board, and the like. For the sake of simplicity, the following description and related drawing figures describe and depict the sealing of a single photonic device submount according to various aspects of the present invention. As will be discussed in greater detail below, however, the present system can be used to seal any number of photonic device submounts on a wafer for mass production.

Figure 1:
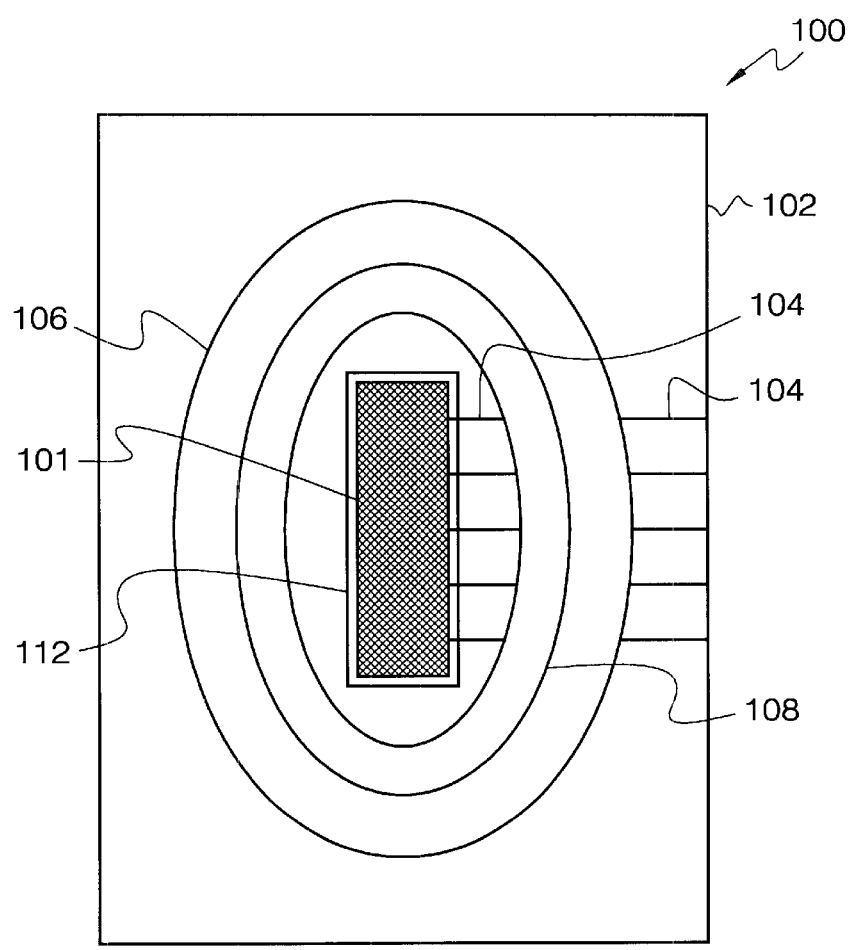
FIG. 1 is a top plan view of a photonic device submount hermetically sealed in accordance with various aspects of the present invention.
Figure 2:
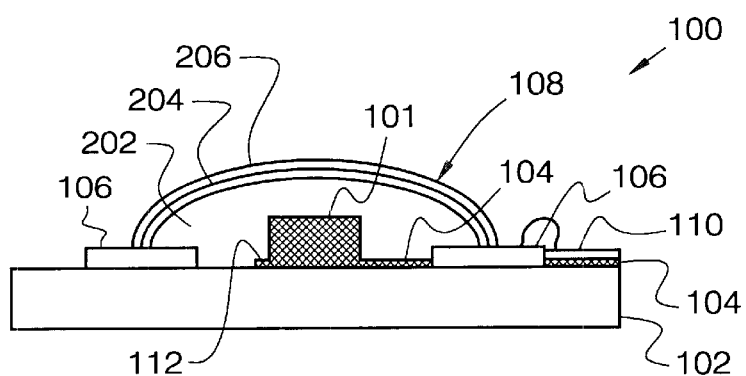
FIG. 2 is a side view of the photonic device submount shown in FIG. 1.
Figure 3:
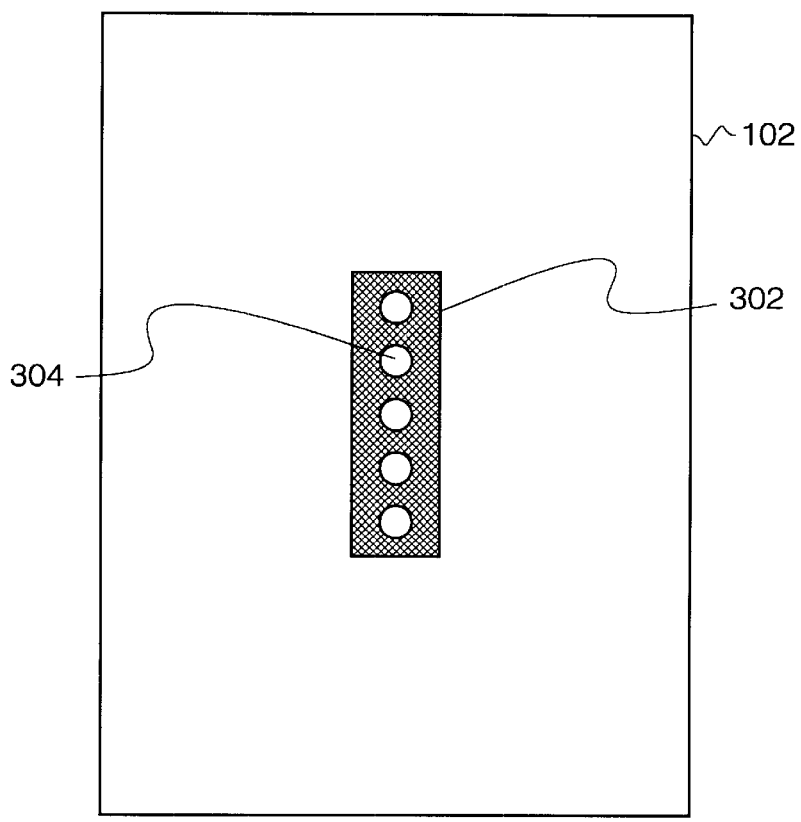
FIG. 3 is a bottom view of the photonic device submount shown in FIG. 1.

With reference to FIGS. 1 through 3, in accordance with various aspects of the present invention, a photonic device submount 100 preferably includes a photonic device 101 suitably mounted to a substrate material 102 and suitably sealed in a hermetic seal 108. In an exemplary embodiment, the photonic device 101 is preferably mounted such that the light emitters (not shown) or light receivers (not shown) of the photonic device 101 faces down to transmit or to receive light through the substrate material 102. Accordingly, in the present exemplary embodiment, the substrate material 102 is preferably formed from a material transmissive to light such as glass, plastic, and the like.

With reference to FIG. 3, a photo-resist layer 302 is suitably formed on the back side of the substrate material 102 with an alignment holes 304 for attaching optical fibers. Alternatively, with reference to FIG. 4, the photo-resist layer 302 can be formed with an alignment slot 402 for attaching to an array of optical fibers. Additionally, although the photo-resist layer 302 is depicted for use with the photonic device 101 having a single line of light emitters or light receivers, the photo-resist layer 302 can be configured with rows of alignment holes 304 or alignment slots 402 for use with the photonic device 101 having any number of lines or arrays of light emitters or light receivers.

The photo resist layer 302 according to various aspects of the present invention facilitates passive alignment of optical fibers to the alignment holes 304 or alignment slot 402. Accordingly, the photonic device 101 need not be activated to align the optical fibers to the light emitters or the light receivers of the photonic device 101. In contrast, in active alignment, the photonic device 101 would need to be activated in order to determine the quality of the signal transmitted to or received from the optical fibers. Thus, passive alignment of optical fibers has the advantages of being less costly, less time consuming, and more conducive to mass production systems than active alignment.

With reference to FIGS. 1 and 2, prior to the mounting of the photonic device 101 on the top side of the substrate material 102, a bonding pad 112 is suitably formed on the substrate material 102 using any convenient method. Additionally, signal lines 104 are also suitably formed on the substrate material 102 using any convenient method. In the present exemplary embodiment, a conductive material, such as gold, silver, copper, titanium, chromium, and the like, is deposited to form the bonding pad 112 and the signal lines 104.

As will be described in greater detail below, when the photonic device 101 is mounted on the bonding pad 112, the photonic device 101 communicates with other components, other communication devices, and the like through the signal lines 104. Therefore, it should be appreciated that the number and configuration of the signals lines 104 can vary depending on the particular application. For example, when the photonic device 101 is configured with one light emitter or receiver, only one or two signal lines may be used for connecting the photonic device 101 to other components, other communication devices, and the like. Additionally, although the signal lines 104 are depicted in the present exemplary embodiment as extending from only one side of the substrate material 102, it should be recognized that any number of signal lines 104 can extend from any number of sides of the substrate material 102.

After the signal lines 104 are formed, a dielectric layer 106 is then suitably formed around the area in which the photonic device 101 is to be mounted and over the signal lines 104. With particular reference to FIG. 2, the dielectric layer 106 electrically isolates the signal lines 104 from the flexible hermetic seal 108. Accordingly, the dielectric layer 106 can be formed from any suitable nonconducting material using any convenient method. In the present exemplary embodiment, an additional layer of glass is deposited onto the substrate material 102 to suitably form the dielectric layer 106. Although the dielectric layer 106 is depicted in FIG. 1 as surrounding the photonic device 101, the dielectric layer 106 can be formed to cover the signal lines 104 without surrounding the photonic device 101. Therefore, it should be appreciated that the shape and configuration of the dielectric layer 106 can vary depending on the particular application.

As will be described in greater detail below, the flexible hermetic seal 108 is formed according to various aspects of the present invention by depositing layers of metal onto an adhesive layer. Accordingly, a removable "lift-off" layer 110 is suitably formed in any areas which are to remain free of the deposited metal. After the flexible hermetic seal 108 is formed, the removable lift-off layer 110 can be peeled off to expose the protected areas. For example, in the present exemplary embodiment, the removable lift-off layer 110 is suitably formed over the portion of the signal lines 104 extending beyond the dielectric layer 106. After the flexible hermetic seal 108 is formed, the removable lift-off layer 110 is peeled off and the exposed portion of the signal lines 104 can then be used for connecting to other components, other communication devices, and the like. Alternatively, the removable lift-off layer 110 can be formed over the entire surface of the substrate 102 and the dielectric layer 106, then the areas which are to be covered by the flexible hermetic seal 108 can be etched away using any convenient method. In the present embodiment, the removable lift-off layer 110 can include photo-resist, tape, and the like.

Figure 4:
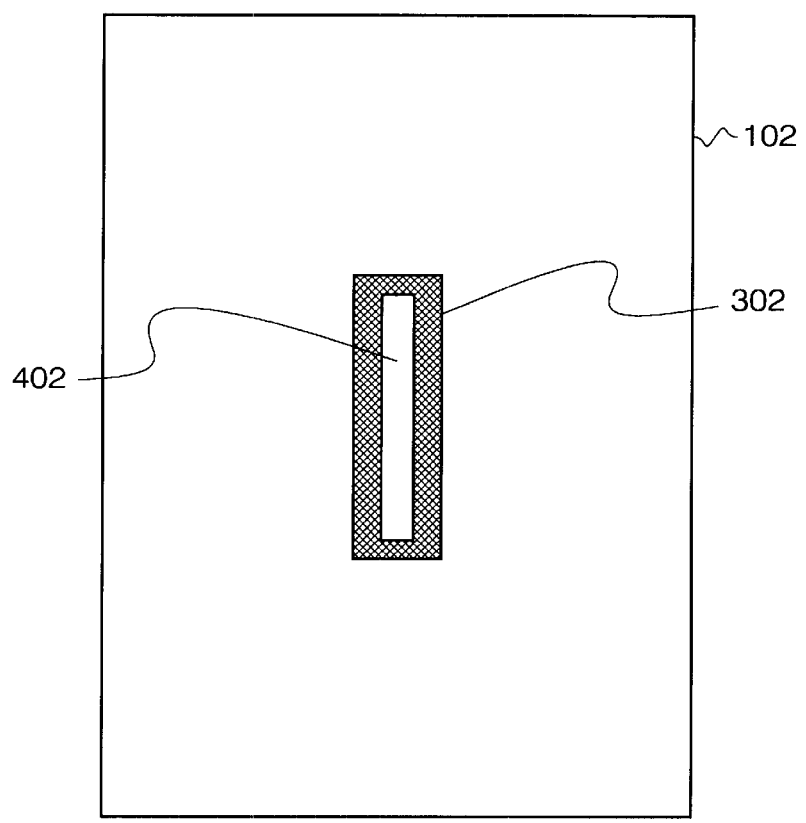
FIG. 4 is a bottom view of an alternative configuration of the photonic device submount shown in FIG. 1.

The processing steps described thus far can be performed as a planar process; meaning that the above described processing steps can be performed on any number of photonic device submounts formed on a large substrate area such as on a wafer. Accordingly, with reference to FIG. 7, a plurality of photonic device submounts 702 are formed in rows and columns on a wafer 700. It should be appreciated that the order of processing of the bottom and the top of the wafer 700 can vary without deviating from the spirit and scope of the present invention. Accordingly, the top of the wafer 700 can be processed to suitably form the photonic device submounts 702, then the bottom of the wafer 700 can be processed to suitably form the alignment holes 304 or the alignment slots 402 for each of the photonic device submounts 702 (FIGS. 3 and 4).

With reference again to FIG. 2, the photonic device 101 is suitably mounted on the bonding pad 112 using any convenient method. In the present exemplary embodiment, the photonic device 101 is preferably bonded to the bonding pad 112 using a flip-chip bonding process. With additional reference to FIGS. 3 and 4, the light emitters or the light receivers of the photonic device 101 are suitably aligned with the alignment holes 304 or the alignment slot 402 formed in the bottom of the substrate 102.

After the photonic device 101 is mounted on the substrate 102, the hermetic seal 108 is suitably formed to seal the photonic device 101. More particularly, an adhesive layer 202 is deposited to cover the photonic device 101. In the present exemplary embodiment, the adhesive layer 202 is an optical grade moisture resistant adhesive such as a high temperature epoxy. The adhesive layer 202 is then cured using any suitable method. For example, the adhesive layer 202 can be placed into an oven to cure the adhesive layer 202. It should be appreciated that the temperature and the exposure time required to cure the adhesive layer 202 depends largely on the particular adhesive used.

After the adhesive layer 202 is suitably cured, a metal layer 204 is then deposited on top of the adhesive layer 202 using any convenient method, such as e-beam deposition, thermal deposition, sputtering, and the like. The metal layer 204 adheres to the adhesive layer 202 to hermetically seal the photonic device 101. In accordance with various aspects of the present invention, the metal layer 204 can include any metal or combination of metals such as chromium, gold, nickel, silver, titanium, and the like. Additionally, the metal layer 204 can also include metallic solder. In the present exemplary embodiment, the metal layer 204 is preferably chromium.

In one configuration of the present exemplary embodiment, a metal layer 206 is suitably deposited on top of the metal layer 204. The metal layer 206 can be deposited using any convenient method, such as e-beam deposition, thermal deposition, sputtering, and the like. The metal layer 206 suitably adheres to the metal layer 204 to provide a stronger and more flexible hermetic seal. In the present exemplary embodiment, the metal layer 206 is preferably gold, however, it should be appreciated that the metal layer 204 and the metal layer 206 can include any metal or combination of metals for any particular application. Additionally, it should be appreciated that the metal layer 206 can be formed using any combination of methods. For example, when the metal layer 206 is gold, a relatively thin layer of gold can be formed using a deposition method. In an exemplary embodiment, a layer of approximately 2000 Å is preferably deposited. A thicker layer of gold can then be formed using an electroplating method to form a thicker layer of gold on top of the initial thin layer of gold. This method of combining a deposition method with an electroplating method has the advantage of reducing the cost of forming a thick layer of gold because an electroplating method is generally less costly than a deposition method, particularly for a precious metal such as gold.

Figure 5:
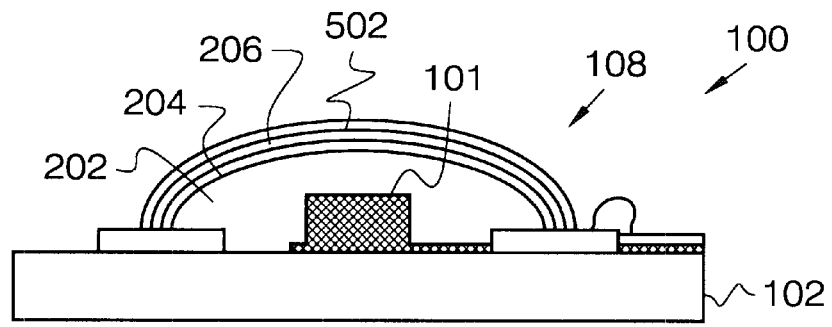
FIG. 5 is a side view of another alternative configuration of the photonic device submount shown in FIG. 1.

With reference to FIG. 5, in an alternative configuration of the present embodiment, a solder layer 502 according to various aspects of the present invention is suitably deposited on top of the metal layer 206 using any convenient method. For example, the solder layer 502 can be electroplated to the metal layer 206 then reflowed to mix with the metal layer 206. In the present exemplary embodiment in which the metal layer 204 is chromium, the metal layer 206 includes two layers of metal; a layer of nickel on top of the layer of chromium (the metal layer 204) and a layer of gold on top of the layer of nickel. Accordingly, when the solder layer 502 is reflowed, the solder layer 502 mixes with the layer of gold in the metal layer 206 and bonds with the layer of nickel in the metal layer 206. In this manner, the size of the hermetic seal 108 can be increased without using additional quantities of gold, which can be costly.

Figure 6:
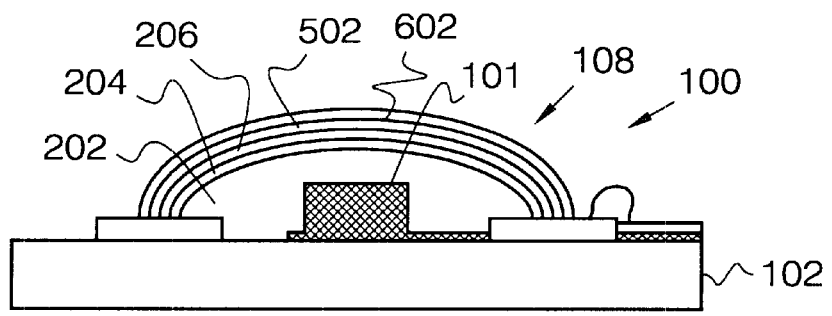
FIG. 6 is a side view of yet another alternative configuration of the photonic device submount shown in FIG. 1.

With reference to FIG. 6, in yet another alternative configuration of the present exemplary embodiment, a protective layer 602 according to various aspects of the present invention is suitably disposed on the solder layer 502 after reflowing the solder layer 502 to mix with the metal layer 206. The protective layer 602 is preferably a conformable and flexible material, such as epoxy, polyamide, and the like, to protect the metal layer 204, the metal layer 206, and the solder layer 502 against scratching and cracking. It should be recognized that the protective layer 602 can be suitably applied to the metal layer 206 if only the metal layers 202 and 204 are to be used (FIG. 2). Similarly, the protective layer 602 can be suitably applied to the metal layer 202 if only the metal layer 202 is to be used.

As described above, with reference again to FIGS. 1 and 2, after the hermetic seal 108 has been suitably formed, the lift-off layer 110 is removed to expose the areas of the photonic device submount 100 which was protected from the metal deposition process used to form the hermetic seal 108. More particularly, with reference to FIG. 2, the lift-off layer 110 is removed to expose the signal lines 104 for connecting to other components, other devices, and the like. Additionally, with reference to FIGS. 3 and 4, optical fibers are suitably aligned and connected to the alignment holes 304 or the alignment slot 402 for connecting to other components, other devices, and the like.

Figure 8A:
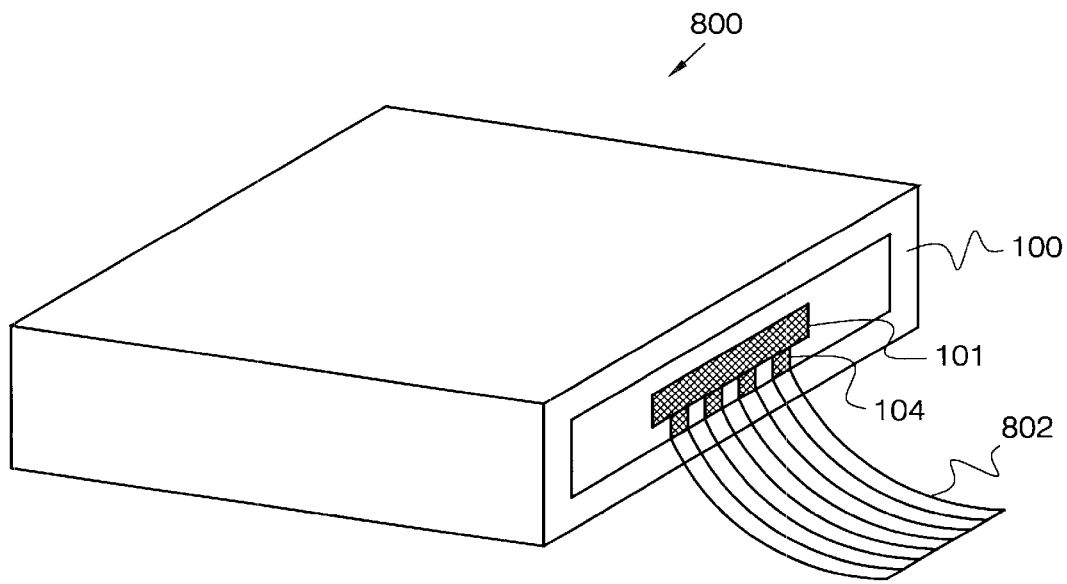
FIGS. 8A and 8B are orthogonal view of photonic device submounts mounted in ferrules in accordance with various aspects of the present invention.
Figure 8B:
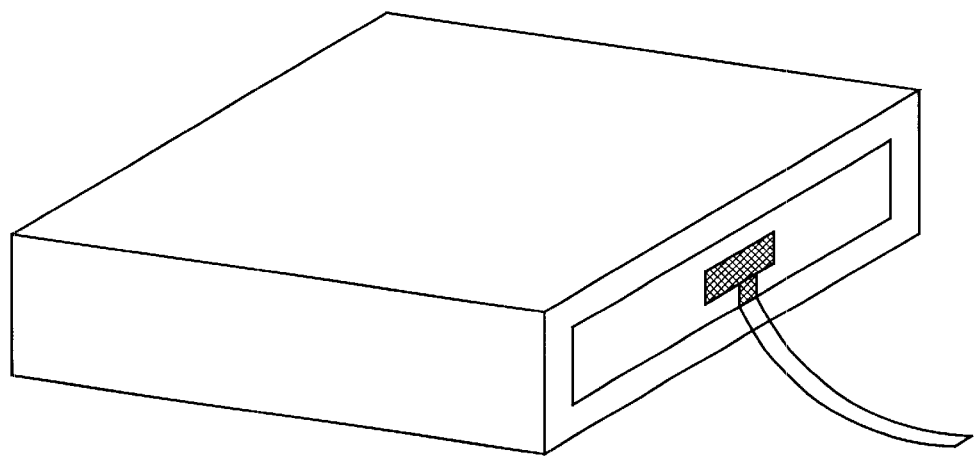

With reference to FIG. 8A, the photonic device submount 100 according to various aspects of the present invention is suitably configured within a ferrule 800. More particularly, the photonic device submount 100 is suitably mounted to one end of the ferrule 800 such that the signal lines 104 can be suitably connected to other components through wires 802. Accordingly, the optical fibers are connected to the bottom side of the photonic device submount 100 which is oriented into the ferrule 800 as depicted in FIG. 8. It should be appreciated that the ferrule 800 can include any convenient ferrule such as an MT ferrule. Additionally, although the photonic device submount 100 is depicted in FIG. 8 as being connected to an array of wires 802, it should be appreciated that the photonic device submount 100 can be connected to any number of wires 802. For example, with reference to FIG. 8B, the photonic device submount 100 is connected to a single wire 804.

Figure 7:
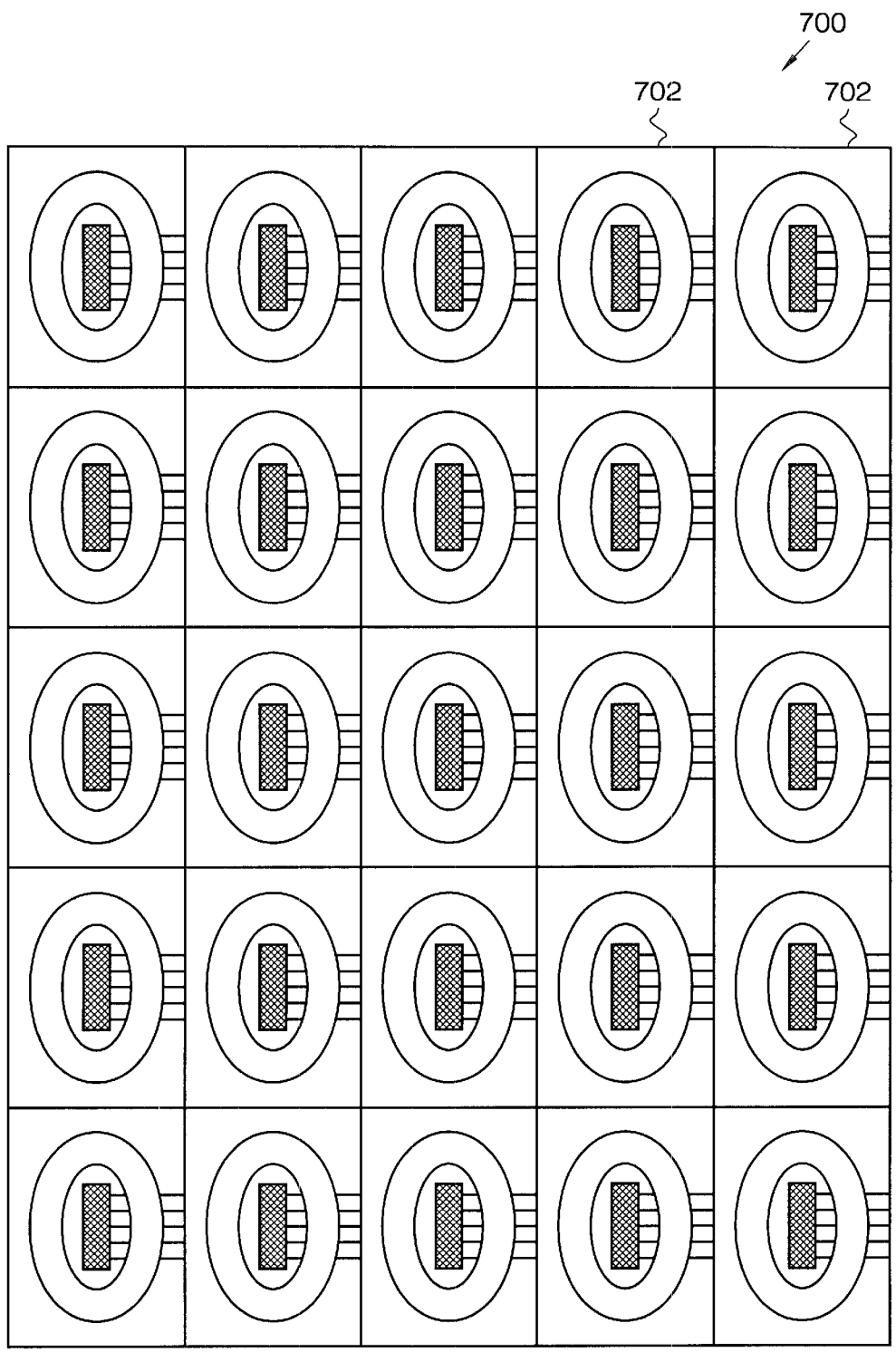
FIG. 7 is a top plan view of a plurality of photonic device submounts formed on a wafer in accordance with various aspects of the present invention.

With reference to FIG. 7, as described above, a plurality of photonic device submounts 702 can be formed on the wafer 700. In this regard, the steps described above for mounting and hermetically sealing the photonic device 101 on the substrate 102 (FIGS. 1 and 2) can be repeated for each photonic device submounts 702 on the wafer 700. The photonic device submounts 702 are then separated using any convenient method such as scribing, sawing, and the like. In this manner, hermetically sealed photonic device submounts can be suitably mass produced.

The flexible hermetic sealing process according to various aspects of the present invention has thus far been described in conjunction with the photonic device submount 100 which is particularly suited for emitting or receiving light through the substrate 102 (FIGS. 1 and 2). However, it should be recognized that the present invention can be used in conjunction with any type of photonic device submount configuration depending on the particular application. For example, the ensuing description and related drawings relate to a free space photonic device submount which emits or receives light through lenses rather than directly into optical fibers. Additionally, for the sake of simplicity, the ensuing description refers to a photonic device configured with light emitters to transmit light, for example, when the photonic device is a VCSEL. However, it should be recognized that the photonic device described below can also be configured with light receivers, for example when the photonic device is a photo-detector.

Figure 9:
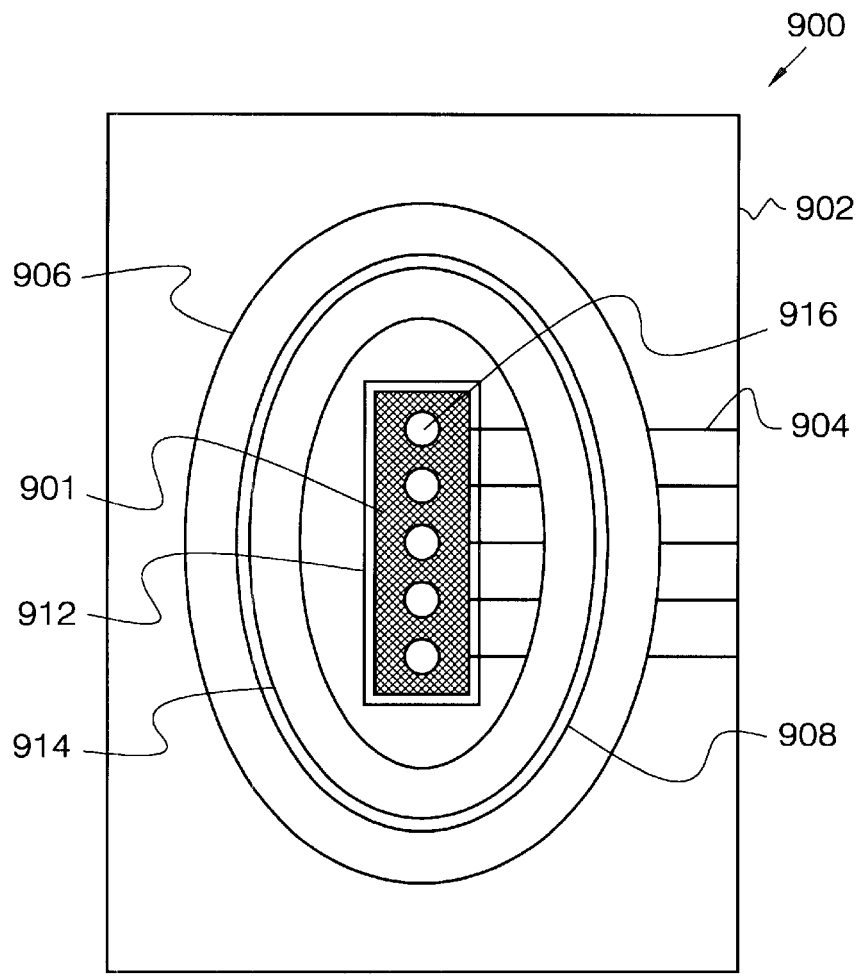
FIG. 9 is a top plan view of another photonic device submount flexibly and hermetically sealed in accordance with various aspects of the present invention.
Figure 10:
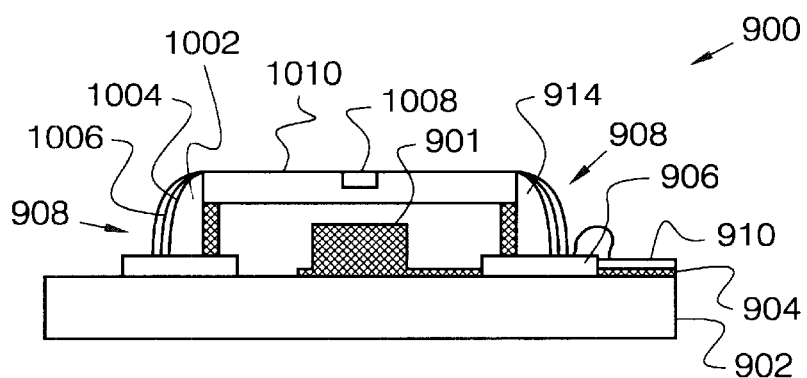
FIG. 10 is a side view of the photonic device submount shown in FIG. 9.

With reference to FIGS. 9 and 10, in accordance with various aspects of the present invention, a photonic device submount 900 preferably includes a photonic device 901 suitably mounted to a substrate material 902 and suitably sealed in a flexible hermetic seal 908. As described above, in this exemplary embodiment, the photonic device 901 is preferably mounted such that light emitters 916 of the photonic device 901 faces substantially vertically upward from the substrate material 102. Accordingly, the substrate material 102 can include any suitable rigid material which is non-transmissive to light such as opaque ceramic, silicon, and the like. However, it should be recognized that the substrate material 102 can also include material which is transmissive to light such as glass, clear plastic, and the like. Additionally, although the photonic device 901 is depicted as having a single row of light emitters 916, it should be recognized that the photonic device 901 can include any number of rows or arrays of light emitters without deviating from the spirit and scope of the present invention.

Similar to the prior exemplary embodiment described above, a bonding pad 901 and signal lines 904 are suitably formed on the substrate material 902 using any convenient method such as deposition, screen printing, and the like. Although in the present exemplary embodiment the signal lines 904 are depicted extending from only side of the substrate material 902, any number of signal lines 904 may extend from any number of sides of the substrate material 902.

Again, similar to the prior exemplary embodiment, after the signal lines 904 are formed on the substrate material 902, a dielectric layer 906 is suitably formed around the area in which the photonic device 901 is to be mounted and over the signal lines 904. With particular reference to FIG. 10, the dielectric layer 906 electrically isolates the signal lines 904 from the flexible hermetic seal 908. Accordingly, the dielectric layer 906 can be formed from any suitable nonconducting material using any convenient method. Although the dielectric layer 106 is depicted in FIG. 9 as surrounding the photonic device 901, the dielectric layer 906 can be formed to cover the signal lines 904 without surrounding the photonic device 901. Therefore, it should appreciated that the shape and configuration of the dielectric layer 906 can vary depending on the particular application.

As will be described in greater detail below, the flexible hermetic seal 908 is formed according to various aspects of the present invention by depositing layers of metal onto an adhesive layer. Accordingly, a removable lift-off layer 910 is suitably formed in any areas which are to remain free of the deposited metal. After the flexible hermetic seal 908 is formed, the removable lift-off layer 910 can be peeled off to expose the protected areas. For example, in the present exemplary embodiment, the removable lift-off layer 910 is suitably formed over the portion of the signal lines 904 extending beyond the dielectric layer 906. After the flexible hermetic seal 908 is formed, the removable lift-off layer 910 is peeled off and the exposed portion of the signal lines 904 can then be used for connected to other components, other communication devices, and the like. Alternatively, the removable lift-off layer 910 can be formed over the entire surface of the substrate 902 and the dielectric layer 906, then the areas which are to be covered by the flexible hermetic seal 908 can be etched away using any convenient method. In the present embodiment, the removable lift-off layer 910 includes photo-resist, tape, and the like.

Similar to the prior exemplary embodiment, the processing steps described thus far can be performed as a planar process; meaning that the above described processing steps can be performed on any number of photonic device submounts formed on a large substrate area such as a wafer. Accordingly, with reference to FIG. 13, a plurality of photonic device submounts 1302 are formed in rows and columns on a wafer 1300.

With reference again to FIGS. 9 and 10, the photonic device 901 is suitably mounted on the bonding pad 912 using any convenient method such as a flip-chip bonding process. A spacer 914 is then suitably disposed to support a cover 1010 over the photonic device 901. Additionally, the spacer 914 according to various aspects of the present invention suitably provides for a gap between the photonic device 901 and the cover 1010. Accordingly, the amount of the gap formed between the photonic device 901 and the cover 1010 can be adjusted by adjusting the height of the spacer 914. It should be recognized that the appropriate amount of gap between the photonic device 901 and the cover 1010 depends largely on the particular application. The spacer 914 can be formed from any suitable rigid material and formed in any size and configuration to support the cover 1010. Additionally, the spacer 914 is preferably formed from a material with a small thermal expansion characteristic or a thermal expansion characteristic similar to the substrate material 901, such as ceramic, glass, and the like.

The cover 1010 includes lenses 1008 through which light can be emitted from the photonic device 901. Accordingly, the lenses 1008 are formed on the cover 1010 to align with the light emitters 916 of the photonic device 901. The lenses 1008 can include any convenient lenses, such as digital lenses, holographic lenses, and the like, and can be formed from any material transmissive to light. Additionally, the cover 1010 may also be formed from a material transmissive to light, in which case the lenses 1008 can be etched onto the cover 1010. Alternatively, the cover 1010 can be formed from a material non-transmissive to light, in which case the lenses 1008 are suitably fixed into the cover 1010.

Figure 14:
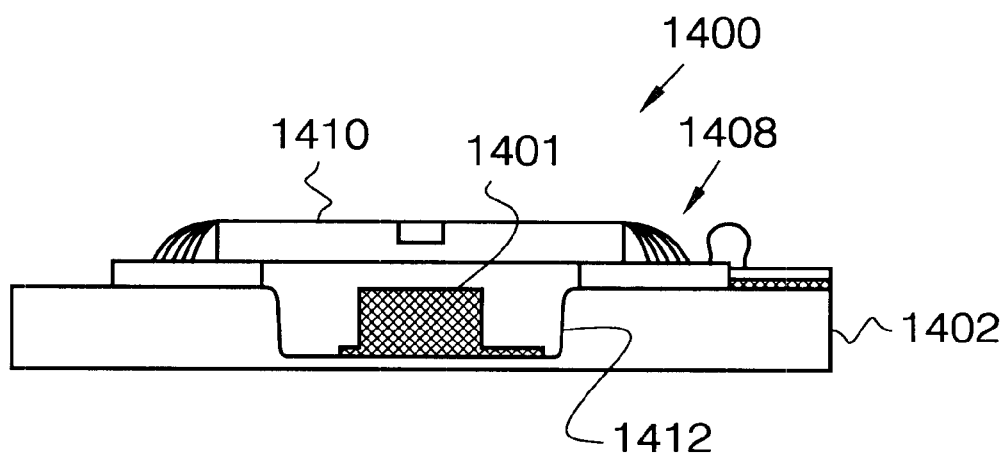
FIG. 14 is a side view of a photonic device submount hermetically sealed in accordance with various aspects of the present invention.

It should be appreciated that the cover 1010 and the spacer 914 can be configured as a single unit such as a cap. Additionally, a positioning guide (not shown), such as a pin, a ring, and the like, can be disposed on the dielectric layer 906 to assist in positioning the spacer 914 on the dielectric layer 906. Alternatively, with reference to FIG. 14, a photonic device submount 1400 can be configured with a substrate 1402 formed with a recess 1414. Accordingly, a flat cover 1410 can be sealed with hermetic seal 1408 over a photonic device 1401 without using a spacer.

With reference again to FIGS. 9 and 10, after the cover 1010 is placed over the photonic device 901, the cover 1010 is suitably covered with a lift-off layer to protect the cover 1010, then the flexible hermetic seal 908 is suitably formed to seal the photonic device 901 and to hold the cover 1010 in place over the photonic device 901. More particularly, an adhesive layer 1002 is deposited adjacent to the spacer 914 and the edges of the cover 1010. As the adhesive layer 1002 remains flexible until it is cured, the cover 1010 can be adjusted to ensure that the lenses 1008 are aligned with the light emitters 916 on the photonic device 901. In the present embodiment, the adhesive layer 1002 is an optical grade moisture resistant adhesive such as a high temperature epoxy. The adhesive layer 1002 is then cured using any convenient method. For example, the adhesive layer 1002 can be placed into an oven to cure the adhesive layer 1002. It should be appreciated that the oven temperature and the exposure time required to cure the adhesive layer 1002 depends largely on the particular adhesive used.

After the adhesive layer 1002 is cured, a metal layer 1004 is then deposited on top of the adhesive layer 1002 using any convenient method, such as e-beam deposition, thermal deposition, sputtering, and the like. The metal layer 1004 adheres to the adhesive layer 1002 to hermetically seal the photonic device 901. The metal layer 1004 can include any metal or combination of metals such as chromium, gold, nickel, silver, titanium, and the like. Additionally, the metal layer 1004 can also include metallic solder. In the present exemplary embodiment, the metal layer 1004 is preferably chromium.

In one configuration of the present exemplary embodiment, a metal layer 1006 is then suitably deposited on top of the metal layer 1004. The metal layer 1006 can be deposited using any convenient method, such as e-beam deposition, thermal deposition, sputtering, and the like. The metal layer 1006 suitably adheres to the metal layer 1004 to provide a stronger and more flexible hermetic seal. In the present exemplary embodiment, the metal layer 1006 is preferably gold, however, it should be appreciated that the metal layer 1004 and the metal layer 1006 can include any metal or combination of metals for any particular application. Additionally, it should be appreciated that the metal layer 1006 can be formed using any combination of methods. For example, when the metal layer 1006 is gold, a relatively thin layer of gold can be formed using a deposition method. In an exemplary embodiment, a layer of approximately 2000 Å is preferably deposited. A thicker layer of gold can then be formed using an electroplating method to form the thicker layer of gold on top of the initial thin layer of gold. This method of combining a deposition method with an electroplating method has the advantage of reducing the cost of forming a thick layer of gold because an electroplating method is generally less costly than a deposition method, particularly for a precious metal such as gold.

Figure 11:
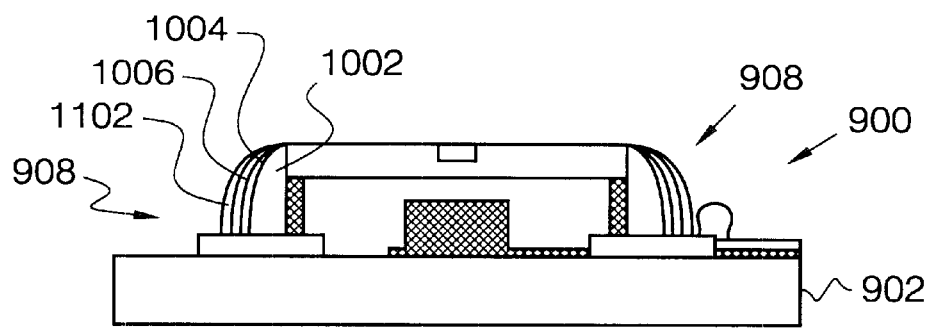
FIG. 11 is a side view of another configuration of the photonic device submount shown in FIG. 9.

With reference to FIG. 11, in an alternative configuration of the present exemplary embodiment, a solder layer 1102 is suitably deposited on top of the layer 1006 using any convenient method. For example, the solder layer 1102 can be electroplated to the metal layer 1006 then reflowed to mix with the metal layer 1006. In the present exemplary embodiment in which the metal layer 1004 is chromium, the metal layer 206 includes two layers of metal; a layer of nickel on top of the layer of chromium (the metal layer 1004) and a layer of gold on top of the layer of nickel. When the solder layer 1102 is reflowed, the solder layer 1102 mixes with the layer of gold in the metal layer 1006 and bonds with the layer of nickel in the metal layer 1006. In this manner, the size of the hermetic seal 908 can be increased without using additional quantities of gold, which is costly.

Figure 12:
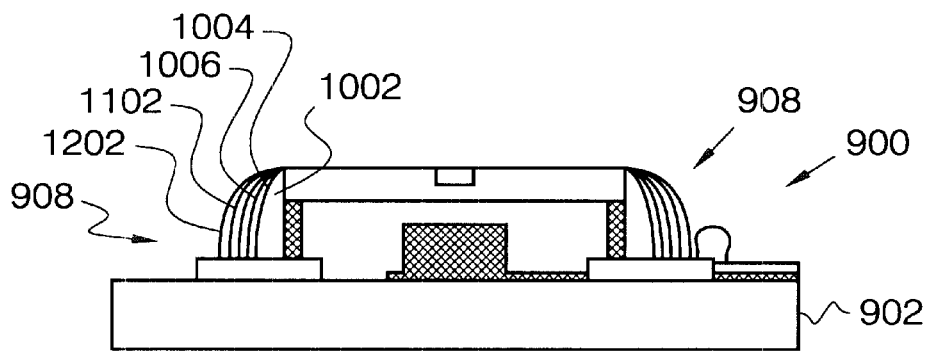
FIG. 12 is a side view of yet another configuration of the photonic device submount shown in FIG. 9.

With reference to FIG. 12, in yet another alternative configuration of the present exemplary embodiment, a protective layer 1202 is suitably disposed on the solder layer 1102 after reflowing the solder layer 1002 to mix with the metal layer 1006. The protective layer 1202 is preferably a conformable and flexible material, such as epoxy, polyamide, and the like, to protect the metal layer 1004, the metal layer 1006, and the solder layer 1102 against scratching and cracking due to temperature variations. It should be recognized that the protective layer 1202 can be applied to the metal layer 1006 if only the metal layers 1002 and 1004 are to be used (FIG. 10). Similarly, the protectively layer 1202 can be applied to the metal layer 1002 if only the metal layer 1002 is to be used.

As described above, with reference again to FIGS. 9 and 10, after the hermetic seal 908 has been suitably formed, the lift-off layer 910 is removed to expose the areas of the photonic device submount 900 which was protected from the metal deposition process used to form the hermetic seal 908. More particularly, with reference to FIG. 10, the lift-off layer 910 is removed to expose the signal lines 904 for connecting to other components, other devices, and the like. Additionally, the lift-off layer which was placed on top of the cover 1010 is also removed.

Figure 13:
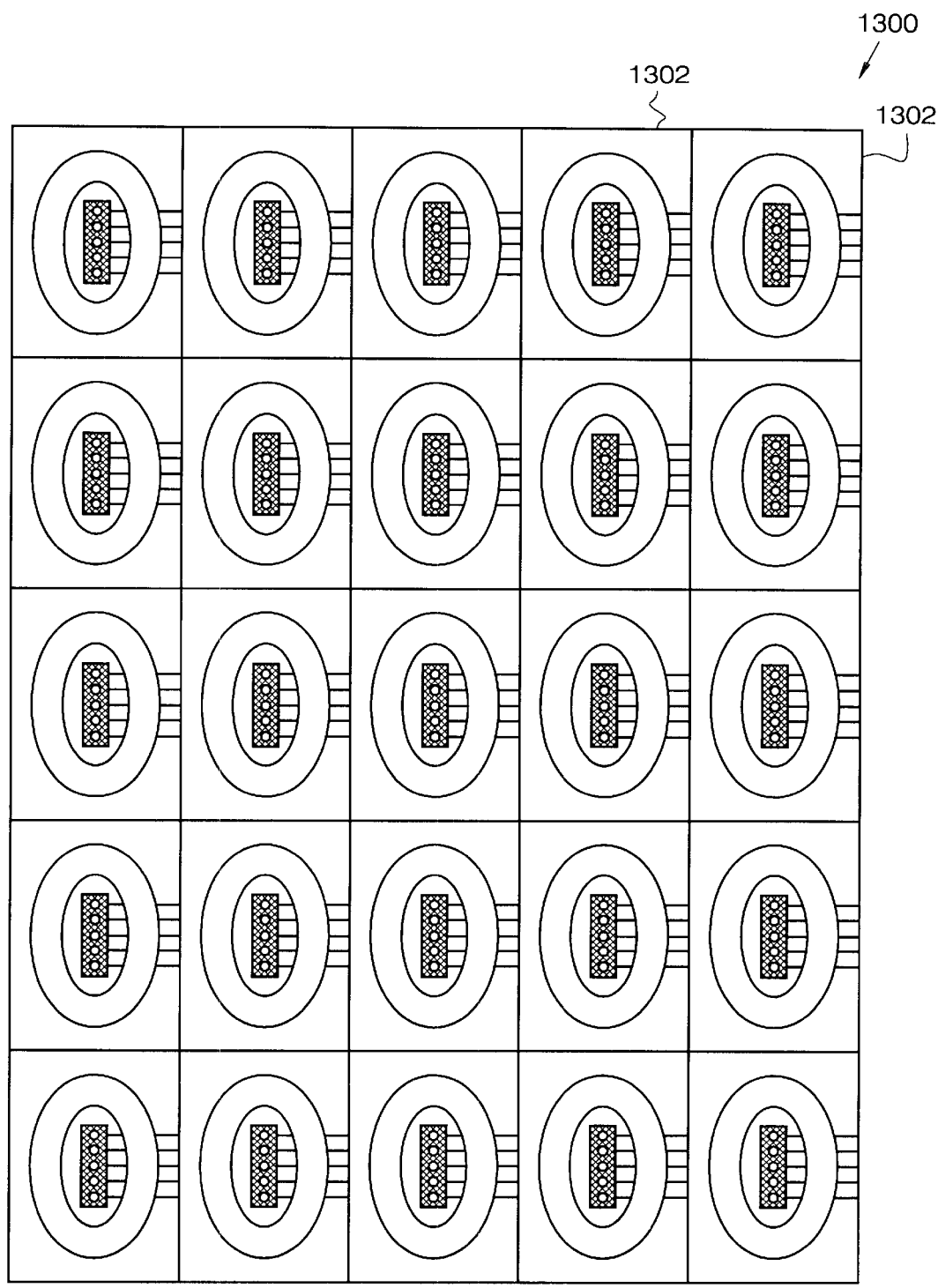
FIG. 13 is a top plan view of a plurality of photonic device submounts formed on a wafer in accordance with various aspects of the present invention.

With reference to FIG. 13, as described above, the plurality of photonic device submounts 1302 can be formed on the wafer 1300. In this regard, the steps described above for mounting and hermetically sealing the photonic device 901 on the substrate 902 (FIGS. 9 and 10) can be repeated for each photonic device submounts 1302 on the wafer 1300. The photonic device submounts 1302 are then separated using any convenient method such as scribing, sawing, and the like. In this manner, hermetically sealed photonic device submounts can be suitably mass produced.

Although the present invention has been described in conjunction with particular embodiments illustrated in the appended drawing figures, various modifications may be made without departing from the spirit and scope of the invention. Therefore, the present invention should not be construed as limited to the specific form shown in the drawings and described above.

What is claimed:

1. A hermetically sealed photonic device submount comprising:
   a substrate material having a top surface;
   a photonic device mounted on said top surface of said substrate material; and
   a hermetic seal sealing said photonic device on said top surface of said substrate material, wherein said hermetic seal comprises an adhesive layer encompassing said photonic device and a first metallic layer disposed on said adhesive layer.

2. A hermetically sealed photonic device submount in accordance with claim 1, wherein said substrate material is transmissive to light and said photonic device is configured to transmit or to receive light through said substrate material.

3. A hermetically sealed photonic device submount in accordance with claim 2, wherein said substrate material is formed from glass.

4. A hermetically sealed photonic device submount in accordance with claim 2, wherein said substrate material has a bottom surface and further comprises a photo resist layer formed on said bottom surface for passive alignment with optical fibers.

5. A hermetically sealed photonic device submount in accordance with claim 4, wherein said photo resist layer is configured with alignment holes for passive alignment of optical fibers.

6. A hermetically sealed photonic device submount in accordance with claim 4, wherein said photo resist layer is configured with an alignment slot for passive alignment optical fibers.

7. A hermetically sealed photonic device submount in accordance with claim 2, wherein said hermetic seal encloses said photonic device mounted on said top surface of said substrate material.

8. A hermetically sealed photonic device submount in accordance with claim 2 further comprising a ferrule, wherein the photonic device is mounted to said ferrule such that said photonic device transmits or receives light into or out of said ferrule.

9. A hermetically sealed photonic device submount in accordance with claim 1, wherein said photonic device is configured to transmit or to receive light substantially vertically upward from said substrate material.

10. A hermetically sealed photonic device submount in accordance with claim 9 further comprising a cover disposed over said photonic device, said cover being configured to permit said photonic device to transmit or to receive light through said cover.

11. A hermetically sealed photonic device submount in accordance with claim 10 wherein said cover is configured with at least one lens configured to facilitate the transmission of light to or from said photonic device.

12. A hermetically sealed photonic device submount in accordance with claim 10 further comprising a spacer disposed between said cover and said substrate material to support said cover over said photonic device and to provide a gap between said cover and said photonic device.

13. A hermetically sealed photonic device submount in accordance with claim 12, wherein said cover and said spacer are sealed to said substrate by said hermetic seal.

14. A hermetically sealed photonic device submount in accordance with claim 1, wherein said first metal layer is chromium.

15. A hermetically sealed photonic device submount in accordance with claim 1, further comprising a second metal layer disposed on said first metal layer.

16. A hermetically sealed photonic device submount in accordance with claim 15, wherein said second metal layer is gold.

17. A hermetically sealed photonic device submount in accordance with claim 15, further comprising a solder layer disposed on said second metal layer.

18. A hermetically sealed photonic device submount in accordance with claim 1, further comprising a flexible protective layer disposed over said first metal layer.

19. A hermetically sealed photonic device submount in accordance with claim 18, wherein said flexible protective layer is a polyamide.

20. A hermetically sealed photonic device submount in accordance with claim 1 further comprising:
   a plurality of signal lines disposed on said top surface of said substrate material; and
   a dielectric layer disposed between said plurality of signal lines and said hermetic seal.

21. A hermetically sealed photonic device submount comprising:
   a substrate material having a top surface, said substrate material being transmissive to light;
   a photonic device mounted on said top surface of said substrate material, said photonic device configured to transmit or to receive light through said substrate material; and
   a hermetic seal formed over said photonic device on said top surface of said substrate material, wherein said hermetic seal comprises an adhesive layer encompassing the photonic device and a first metallic layer disposed on said adhesive layer.

22. A hermetically sealed photonic device submount in accordance with claim 21, wherein said substrate material is formed from glass.

23. A hermetically sealed photonic device submount in accordance with claim 21, wherein said substrate material has a bottom surface and further comprises a photo resist layer formed on said bottom surface for passive alignment of optical fibers.

24. A hermetically sealed photonic device in accordance with claim 21, wherein said hermetic seal comprises a second metal layer disposed over said first metal layer.

25. A hermetically sealed photonic device submount in accordance with claim 24, wherein said hermetic seal further comprises a solder layer disposed over said second metal layer.

26. A hermetically sealed photonic device submount comprising:
   a substrate material having a top surface;
   a photonic device mounted on said top surface of said substrate material;
   a cover disposed over said photonic device, wherein said photonic device is configured to transmit or to receive light through said cover; and
   a hermetic seal sealing said cover to said substrate material, wherein said hermetic seal comprises an adhesive layer disposed around the edges of said cover and a first metallic layer disposed on said adhesive layer.

27. A hermetically sealed photonic device submount in accordance with claim 26 further comprising a spacer disposed under said cover to support said cover over said photonic device and to provide a gap between said cover and said photonic device.

28. A hermetically sealed photonic device submount in accordance with claim 26 wherein said cover is configured with lenses for facilitating transmission of light to or from said photonic device.

29. A hermetically sealed photonic device submount in accordance with claim 26 wherein said hermetic seal further comprises a second metal layer disposed over said first metal layer.

\* \* \* \* \*